US012462727B2

(12) United States Patent
Chen et al.

(10) Patent No.: US 12,462,727 B2
(45) Date of Patent: *Nov. 4, 2025

(54) ELECTRONIC DEVICE

(71) Applicant: InnoLux Corporation, Miao-Li County (TW)

(72) Inventors: Ya-Ling Chen, Miao-Li County (TW); Shu-Fen Li, Miao-Li County (TW); Chuan-Chi Chien, Miao-Li County (TW); I-An Yao, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/677,915

(22) Filed: May 30, 2024

(65) Prior Publication Data

US 2024/0355260 A1 Oct. 24, 2024

Related U.S. Application Data

(63) Continuation of application No. 17/960,814, filed on Oct. 5, 2022, now Pat. No. 12,027,095, which is a
(Continued)

(30) Foreign Application Priority Data

Nov. 24, 2020 (CN) .......................... 202011332650.8

(51) Int. Cl.
*G09G 3/20* (2006.01)
*G09F 9/30* (2006.01)
*G09G 3/3208* (2016.01)

(52) U.S. Cl.
CPC ............. *G09G 3/2092* (2013.01); *G09F 9/30* (2013.01); *G09G 3/3208* (2013.01); *G09G 2300/0408* (2013.01); *G09G 2300/0426* (2013.01); *G09G 2300/043* (2013.01); *G09G 2310/0221* (2013.01); *G09G 2310/0278* (2013.01); *G09G 2310/0286* (2013.01); *G09G 2310/0297* (2013.01); *G09G 2360/144* (2013.01)

(58) Field of Classification Search
CPC ............... G09G 3/2092; G09G 3/3208; G09G 2300/0408; G09G 2300/0426; G09G 2300/043; G09G 2310/0221; G09G 2310/0278; G09G 2310/0286; G09G 2310/0297; G09G 2360/144; G09F 9/30
See application file for complete search history.

(56) References Cited

U.S. PATENT DOCUMENTS 12,027,095 B2 * 7/2024 Chen .................... G09G 3/2092
2001/0035848 A1 * 11/2001 Johnson ............... G09G 3/3233
345/76

(Continued)

*Primary Examiner* — Adam J Snyder
(74) *Attorney, Agent, or Firm* — Winston Hsu

(57) ABSTRACT

An electronic device having a light emitting region includes a base, a data line disposed on the base, a driving element disposed on the base, a light emitting element disposed on the base and corresponding to the light emitting region, an optical sensing element configured to sense a light and generate a signal, and a signal line electrically connected to the optical sensing element and configured to transmit the signal. At least a portion of the data line is corresponding to the light emitting region. The signal line is overlapped with the data line.

7 Claims, 9 Drawing Sheets

Related U.S. Application Data continuation of application No. 17/500,903, filed on Oct. 13, 2021, now Pat. No. 11,495,166.

(56) References Cited

U.S. PATENT DOCUMENTS

2005/0275616 A1* 12/2005 Park ................. G06F 3/0412
                                                                           345/102
2013/0194199 A1* 8/2013 Lynch ............... G06F 3/0412
                                                                           445/24

* cited by examiner

ELECTRONIC DEVICE

CROSS REFERENCE TO RELATED APPLICATIONS

This application is a continuation application of U.S. application Ser. No. 17/960,814, filed on Oct. 5, 2022, which is a continuation application of U.S. application Ser. No. 17/500,903, filed on Oct. 13, 2021. The contents of these applications are incorporated herein by reference.

BACKGROUND OF THE DISCLOSURE

1. Field of the Disclosure

The present disclosure relates to an electronic device, and more particularly to an electronic device having narrow frame design.

2. Description of the Prior Art

In recent years, with the increasing requirements of users for electronic devices, the electronic devices may include peripheral elements such as ambient light sensing elements to improve the display performance of the electronic devices. However, when the peripheral elements of the electronic device increase, the space required in the peripheral region may also increase, and the screen-to-body ratio may be reduced. Therefore, to improve the spatial configuration of peripheral elements of electronic devices has become an important issue in the electronic industry.

SUMMARY OF THE DISCLOSURE

An electronic device is provided by the present disclosure. The electronic device has a light emitting region and includes a base, a data line disposed on the base, a driving element disposed on the base, a light emitting element disposed on the base and corresponding to the light emitting region, an optical sensing element configured to sense a light and generate a signal, and a signal line electrically connected to the optical sensing element and configured to transmit the signal. At least a portion of the data line is corresponding to the light emitting region. The signal line is overlapped with the data line.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. In addition, the term "electrical connection" may be a direct electrical connection or an indirect electrical connection through other elements.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
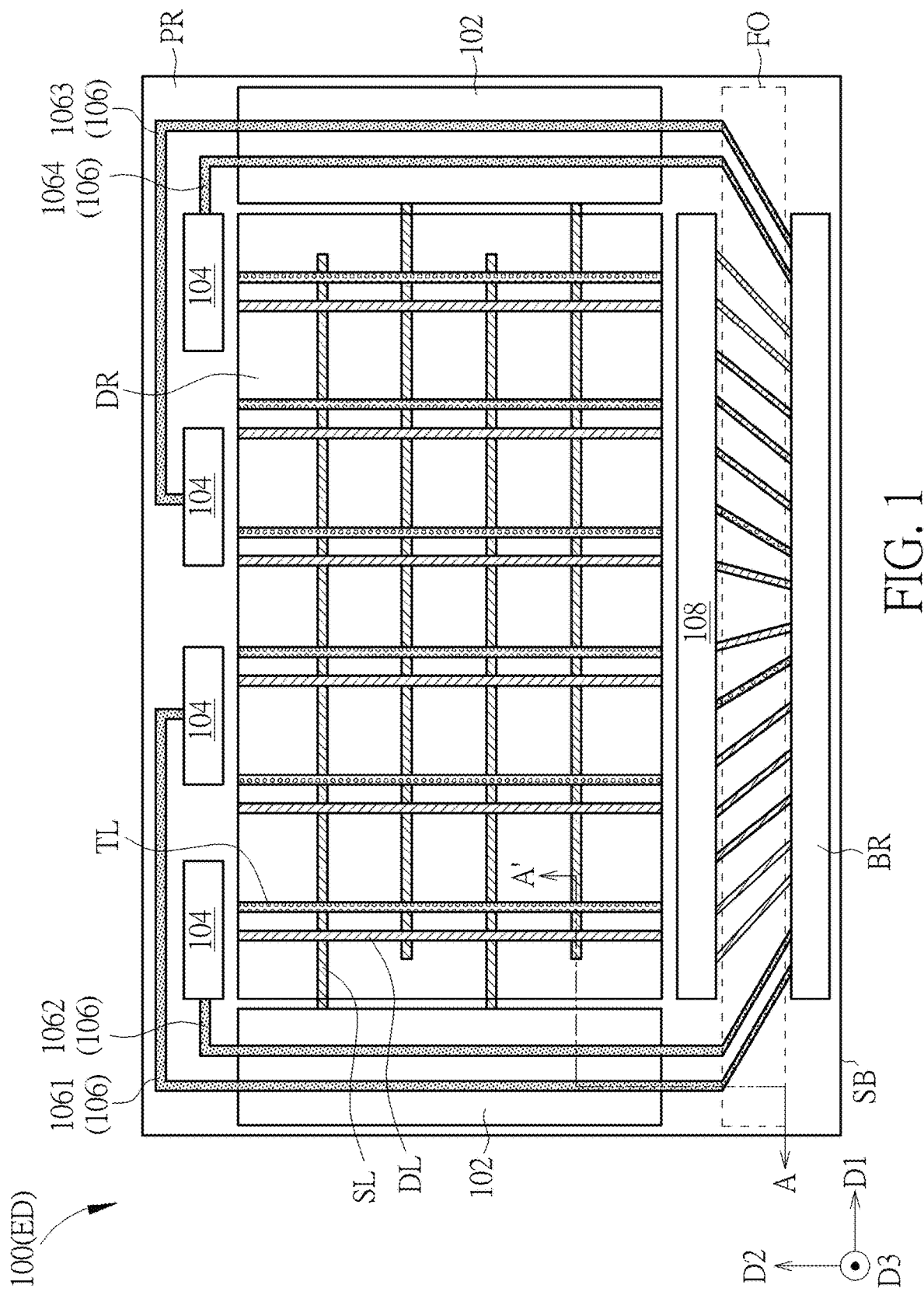
FIG. 1 schematically illustrates a top view of an electronic device according to a first embodiment of the present disclosure.
Figure 2:
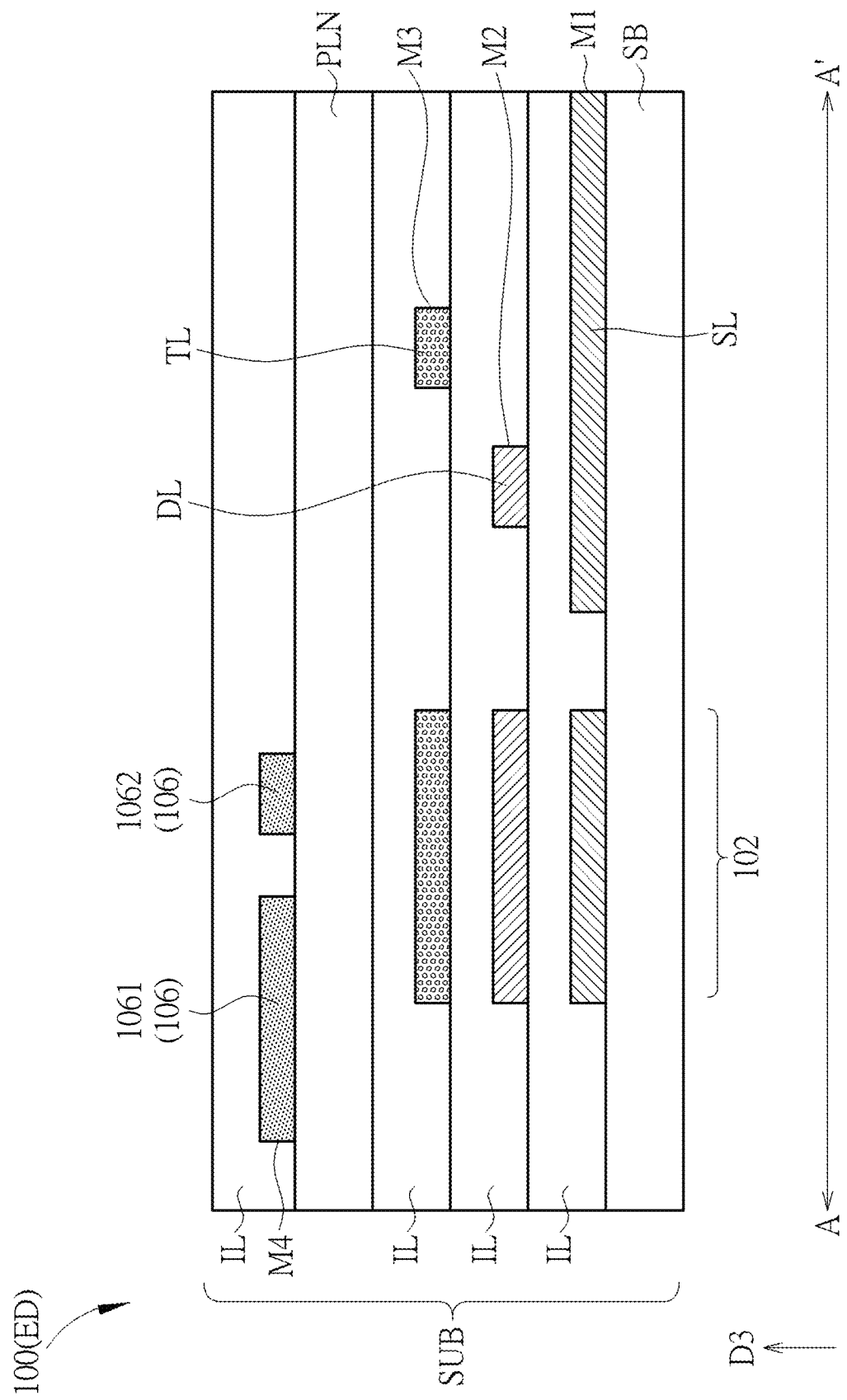
FIG. 2 schematically illustrates a cross-sectional view of the electronic device according to the first embodiment of the present disclosure along a section line A-A'.

Referring to FIG. 1, FIG. 1 schematically illustrates a top view of an electronic device according to a first embodiment of the present disclosure. As shown in FIG. 1, the electronic device ED may include display devices that can display static or dynamic images or screens according to the demands and operations of users in the present embodiment, but not limited thereto. The display device of the present disclosure may for example be any type of display device, such as a self-luminous display device or a non-self-luminous display device. The self-luminous display device may include light emitting diodes, a light converting layer, other suitable materials or the combinations of the above-mentioned materials, but not limited thereto. The light emitting diode (LED) may for example include organic LED, mini LED, micro LED or quantum dot LED (QLED, QDLED), but not limited thereto. The light converting layer may include wavelength converting materials and/or light filtering materials. The light converting layer may for example include fluorescence, phosphor, quantum dot (QD), other suitable materials or the combinations of the above-mentioned materials, but not limited thereto. The non-self-luminous display device may include liquid crystal display device, but not limited thereto. The display device may for example be applied to laptops, common displays, tiled displays, vehicle displays, touch displays, television, surveillance cameras, smart phones, tablets, light source modules, light emitting devices or electronic devices of the above-mentioned products, but not limited thereto. In the following, the display device 100 is taken as an example of the electronic device ED for describing the contents of the present disclosure, but the present disclosure is not limited thereto. According to the present embodiment, as shown in FIG. 1, the display device 100 may include a substrate SUB (as shown in FIG. 2, which will not be redundantly described in the following), a gate driving circuit 102, at least one ambient light sensing element 104 and at least one ambient light sensing signal line 106, but not limited thereto. For example, the display device 100 shown in FIG. 1 may include the substrate SUB, two gate driving circuits 102, four ambient light sensing elements 104 and four ambient light sensing signal lines 106 respectively electrically connected to one of the ambient light sensing elements 104, but not limited thereto. It should be noted that the specific disposition and the number of the elements or the layers shown in FIG. 1 are just exemplary, and the present disclosure is not limited thereto. In some embodiments, the numbers of the gate driving circuit 102 and the ambient light sensing element 104 may be adjusted according to the demands of the design. In addition, although one ambient light sensing element 104 is only electrically connected to one ambient light sensing signal line 106 in FIG. 1, the present disclosure is not limited thereto. In some embodiments, one ambient light sensing element 104 may be electrically connected to more than one ambient light sensing signal lines 106. According to the present embodiment, the substrate SUB may include a base SB, wherein the base SB may include flexible base, rigid base or the combinations of the above-mentioned bases. The material of the base SB may for example include polyimide (PI), polycarbonate (PC), polyethylene terephthalate (PET), glass, ceramic, quartz, sapphire, other suitable materials or the combinations of the above-mentioned materials, but not limited thereto. The gate driving circuit 102 may be disposed on the base SB, and the gate driving circuit 102 may be used to drive a plurality of scan lines (such as the scan line SL shown in FIG. 1) of the display device 100 to display images. The gate driving circuit 102 may include amplifiers, signal lines, shift registers, or other suitable elements, but not limited thereto. The ambient light sensing element 104 is disposed on the base SB, the ambient light sensing element 104 may be used to receive ambient light information and convert the ambient light information into a signal (such as an electrical signal), and the brightness of the display device 100 may be adjusted through the signal to improve the user's viewing experience. In the present embodiment, the ambient light sensing element 104 may for example include a PIN diode, other suitable light sensing elements or the combinations of the above-mentioned materials, but not limited thereto. The ambient light sensing signal line 106 may be disposed on the base BS and electrically connected to the ambient light sensing element 104, wherein the ambient light sensing signal line 106 may include the signal lines included in the ambient light sensing element 104 or the signal lines for transmitting electrical signals, the present disclosure is not limited thereto. The ambient light sensing signal line 106 may include copper, silver, gold, aluminum, other suitable conductive materials or the combinations of the above-mentioned materials, but not limited thereto.

According to the present embodiment, as shown in FIG. 1, the display device 100 may include the substrate SUB, wherein the substrate SUB may include a display region DR and a peripheral region PR, wherein the display region DR may for example be defined though the distribution area of a plurality of pixels of the display device 100. In detail, the display region DR of the display device 100 may include a plurality of pixels (or sub-pixels), and each of the pixels may for example correspond to a light emitting unit (not shown in FIG. 1) and the driving element (such as thin film transistor, not shown in FIG. 1) and other related elements corresponding to the light emitting unit, but not limited thereto. In some embodiments, when the display device 100 includes non-self-luminous display devices, each of the pixels may for example correspond to a light modulating unit (for example, a portion of the liquid crystal layer and the corresponding pixel electrodes and/or color filters) and the driving element and other related elements corresponding to the light modulating unit. In the present embodiment, the display region DR may for example be defined as the region enclosed by the outer edge of the outermost pixels among the pixels, and the region other than the display region DR may be defined as the peripheral region PR, but not limited thereto. The display region DR may for example correspond to the light emitting region of the display device 100, and the peripheral region PR may for example be used to dispose peripheral elements and/or peripheral circuits, but not limited thereto. In the present embodiment, as shown in FIG. 1, the gate driving circuits 102, the ambient light sensing elements 104, and the ambient light sensing signal lines 106 may be disposed in the peripheral region PR of the display device 100, but not limited thereto. In addition, a plurality of scan lines SL and data lines DL may be included in the display region DR and disposed on the base SB. As shown in FIG. 1, the scan lines SL may for example extend along a first direction D1, and the data lines DL may for example extend along a second direction D2, where the first direction D1 may be substantially perpendicular to the second direction D2, and a third direction D3 may be substantially perpendicular to the first direction D1 or the second direction D2, but not limited thereto. Each of the scan lines SL may be electrically connected to one of the gate drive circuits 102, and the switch of the scan line SL can be driven by the gate drive circuit 102 electrically connected to the scan line SL. For example, as shown in FIG. 1, a portion of the scan lines SL may be electrically connected to the gate driving circuit 102 at the left side, and another portion of the scan lines SL may be electrically connected to the gate driving circuit 102 at the right side. That is, the gate driving circuit 102 at the left side may drive a portion of the scan lines SL, and the gate driving circuit 102 at the right side may drive another portion of the scan lines SL. However, the electrical connection between the scan lines SL and the gate driving circuits 102 of the present disclosure is not limited to what is shown in FIG. 1.

The display device 100 of the present embodiment may further include touch elements to provide a touch function of the display device 100 in addition to the above-mentioned elements or layers. In detail, as shown in FIG. 1, the display region DR of the display device 100 may include a plurality of touch signal lines TL disposed on the base SB, but not limited thereto. It should be noted that the touch signal lines TL shown in FIG. 1 may be touch elements such as the electrode strings formed of touch electrodes, the wires used to connect the touch electrodes in series, the wires respectively electrically connected to the touch electrodes or other suitable wires or elements etc., and FIG. 1 just exemplarily shows the touch signal lines TL disposed on the base SB as a representative of providing touch function. The disposition of the touch signal lines TL of the present disclosure is not limited to what is shown in FIG. 1. The touch signal line TL may include metal conductive materials, transparent conductive materials or the combinations of the above-mentioned materials, but not limited thereto. In addition, although FIG. 1 just shows the touch signal lines TL extending along the second direction D2, the present disclosure is not limited thereto. In some embodiments, the touch signal lines TL may extend along the first direction D1 and the second direction D2 respectively and are staggered on the base SB. Moreover, although it is not shown in FIG. 1, the display device 100 may further include signal transmitting lines electrically connected to the touch signal lines TL, wherein the signal transmitting lines may for example be disposed in the peripheral region PR, and the signal transmitting lines may serve to transmit touch signals received by the touch signal lines TL to a processing unit for analysis.

According to the present embodiment, the display device 100 may further include other types of peripheral elements. In detail, as shown in FIG. 1, the display device 100 may include a first peripheral element 108 disposed in the peripheral region PR, wherein the first peripheral element 108 may for example include a multiplexer (MUX) in the present embodiment, but not limited thereto. The multiplexer may for example be used to control signal output selection to reduce the number of signal lines in the peripheral region PR. For example, the first peripheral element 108 (multiplexer) shown in FIG. 1 may selectively output the signals of the data lines DL or the signals of the touch signal lines TL, but not limited thereto. In the present embodiment, the display device 100 may further include a connection region BR located in the peripheral region PR. As shown in FIG. 1, a plurality of connection pads (not shown in FIG. 1) may be included in the connection region BR, and the connection pads may be electrically connected to the processing unit to transmit signals between the wires and the processing unit on the base SB. For example, as shown in FIG. 1, the ambient light sensing signal lines 106 may extend through the fan out region FO of the display device 100 and be electrically connected to the connection pads in the connection region BR, such that the ambient light signals detected by the ambient light sensing elements 104 may be transmitted through the ambient light sensing signal lines 106 and the connection pads to the processing unit for analysis. In addition, the signals of the data lines DL (display signal) or the signals of the touch signal lines TL (touch signal) selectively output by the first peripheral element 108 (such as the multiplexer) may be electrically connected to the connection pads in the connection region BR through electrically connecting to the signal lines (such as the signal lines in the fan out region FO shown in FIG. 1) in the connection region BR, such that the display signals and/or the touch signals may be transmitted to the processing unit, but not limited thereto. In some embodiments, the processing unit may for example be an integrated circuit, the processing unit may be disposed in a flexible printed circuit board (FPCB), and the FPCB may be electrically connected to the connection pads in the connection region BR, but not limited thereto. In addition, although it is not shown in FIG. 1, the gate driving circuit 102 of the display device 100 may be electrically connected to the connection pads in the connection region BR through at least one signal transmitting line.

Referring to FIG. 2, FIG. 2 schematically illustrates a cross-sectional view of the electronic device according to the first embodiment of the present disclosure along a section line A-A'. According to the present embodiment, as shown in FIG. 2, the display device 100 may include the substrate SUB, wherein the substrate SUB may include a first metal layer M1, a second metal layer M2, a third metal layer M3, a fourth metal layer M4 and insulating layers IL covering each of the metal layers, but not limited thereto. The first metal layer M1, the second metal layer M2, the third metal layer M3, the fourth metal layer M4 and the insulating layers IL covering each of the metal layers may be disposed on the base SB in sequence, but not limited thereto. It should be noted that in order to simplify the figure, FIG. 2 only shows the base SB, the first metal layer M1, the second metal layer M2, the third metal layer M3 and the fourth metal layer M4, and other elements or layers of the display device 100 are omitted. In addition, although the base SB shown in FIG. 2 is a single layer structure, the present disclosure is not limited thereto. In some embodiments, the base SB may include multi-layer structure. As shown in FIG. 2, in the present embodiment, the scan line SL may be located in the first metal layer M1 or formed of the first metal layer M1, the data line DL may be located in the second metal layer M2 or formed of the second metal layer M2, and the touch signal line TL or at least a portion of the touch signal line TL may be located in the third metal layer M3 or formed of the third metal layer M3, but not limited thereto. In some embodiments, according to the designs of the display device 100, the scan line SL may be located in the second metal layer M2, and the data line DL may be located in the first metal layer M1. In the present embodiment, the gate driving circuit 102 may be located in the first metal layer M1, the second metal layer M2 and the third metal layer M3. In other words, the gate driving circuit 102 may be formed of the first metal layer M1, the second metal layer M2 and the third metal layer M3, but not limited thereto. In some embodiments, the gate driving circuit 102 may be located in the first metal layer M1 and/or the second metal layer M2. In other words, the gate driving circuit 102 may be formed of the first metal layer M1 and/or the second metal layer M2, but not limited thereto. It should be noted that although the gate driving circuit 102 is shown as the single-layer structures respectively located in the first metal layer M1, the second metal layer M2 and the third metal layer M3, it is just exemplary. The structure and disposition of the gate driving circuit 102 of the present disclosure is not limited to what is shown in FIG. 2. As mentioned above, the gate driving circuit 102 may include elements such as amplifiers, signal lines, and/or shift registers, and the shift register may for example include electronic elements such as thin film transistors (TFT) and/or capacitors, but not limited thereto. In another aspect, since multiple metal layers may be disposed on the base SB in the present embodiment, the connection pads in the connection region BR mentioned above may for example be disposed in more than one metal layers. For example, a portion of the connection pads may be disposed in a metal layer (such as the first metal layer M1), and another portion of the connection pads may be disposed in another metal layer (such as the second metal layer M2), such that the transfer of the signal lines may be reduced, thereby simplifying the process, but the present disclosure is not limited thereto.

According to the present embodiment, the ambient light sensing signal line 106 and the gate driving circuit 102 may be located in different metal layers or formed of different metal layers, and the ambient light sensing signal line 106 and the gate driving circuit 102 located in different metal layers may at least partially overlap each other in a top view direction of the substrate SUB, but not limited thereto. In detail, as shown in FIG. 2, the ambient light sensing signal line 106 may be located in the fourth metal layer M4 in the present embodiment. In addition, the ambient light sensing signal line 106 may overlap the gate driving circuit 102 located in the first metal layer M1, the second metal layer M2 and the third metal layer M3 in the top view direction (the third direction D3) of the substrate SUB, but not limited thereto. That is, viewed from the top view direction (the third direction D3) of the substrate SUB, the ambient light sensing signal line 106 may extend across and pass through the gate driving circuit 102, as shown in FIG. 1, but not limited thereto. It should be noted that "the ambient light sensing signal line 106 overlaps the gate driving circuit 102" mentioned above may represent that at least one ambient light sensing signal line 106 overlaps the gate driving circuit 102. In addition, "the ambient light sensing signal line 106 overlaps the gate driving circuit 102" mentioned above may for example represent that the ambient light sensing signal line 106 overlaps the elements (such as the switch elements, the signal lines or the amplifiers) of the gate driving circuit 102 other than the shift registers, but not limited thereto. Since the ambient light sensing signal line 106 does not overlap the shift registers in the gate driving circuit 102, the parasitic capacitance between the ambient light sensing signal line 106 and the shift registers may be reduced, and the possibility that the scan line SL driving function of the gate driving circuit 102 is affected by the parasitic capacitance may be reduced. In normal display devices, the ambient light sensing signal lines and the gate driving circuit are usually disposed in the peripheral region, such that the space required in the peripheral region may increase, and the width of the frame of the display device may increase accordingly. However, in the present embodiment, since the ambient light sensing signal line 106 and the gate driving circuit 102 may be disposed in different metal layers, the ambient light sensing signal line 106 and the gate driving circuit 102 may at least partially overlap each other to reduce the width of the frame of the display device 100, thereby increasing the screen-to-body ratio of the display device 100. In addition, as shown in FIG. 2, the display device 100 may further include a planarization layer PLN disposed between the third metal layer M3 in which the gate driving circuit 102 is located and the fourth metal layer M4 in which the ambient light sensing signal line 106 is located in the present embodiment, but not limited thereto. The planarization layer PLN may include any suitable organic insulating material, inorganic insulating material or the combinations of the above-mentioned materials. In the present embodiment, since the planarization layer PLN may be located between the third metal layer M3 and the fourth metal layer M4, the parasitic capacitance between the ambient light sensing signal line 106 and the gate driving circuit 102 may be reduced, thereby improving the performance of the display device 100.

Other embodiments or variant embodiments of the present disclosure will be described in the following. In order to simplify the description, the same layers or elements in the following embodiments would be labeled with the same symbol, and the features thereof will not be redundantly described. The differences between the embodiments will be detailed in the following.

Figure 3:
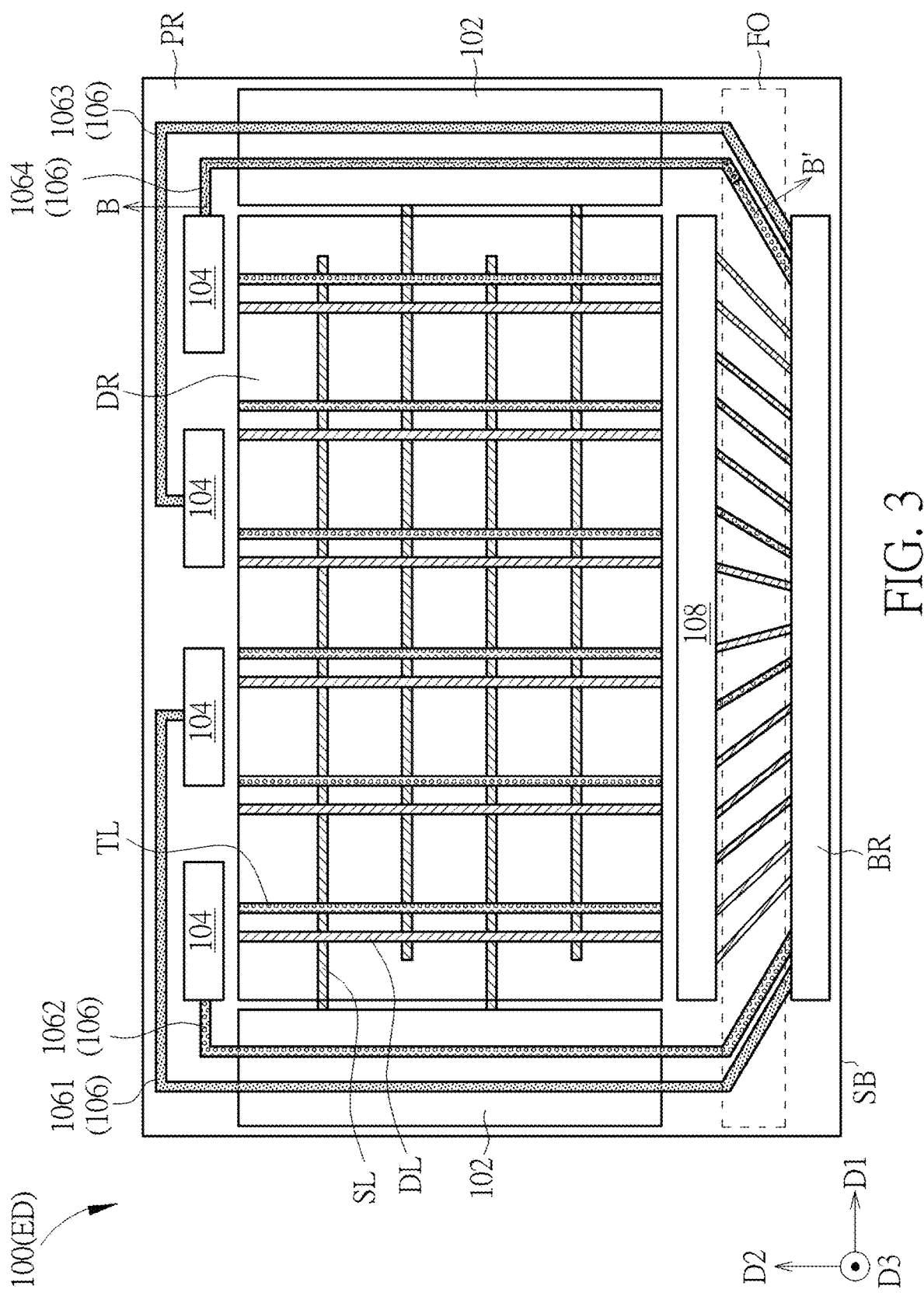
FIG. 3 schematically illustrates a top view of an electronic device according to a second embodiment of the present disclosure.
Figure 4:
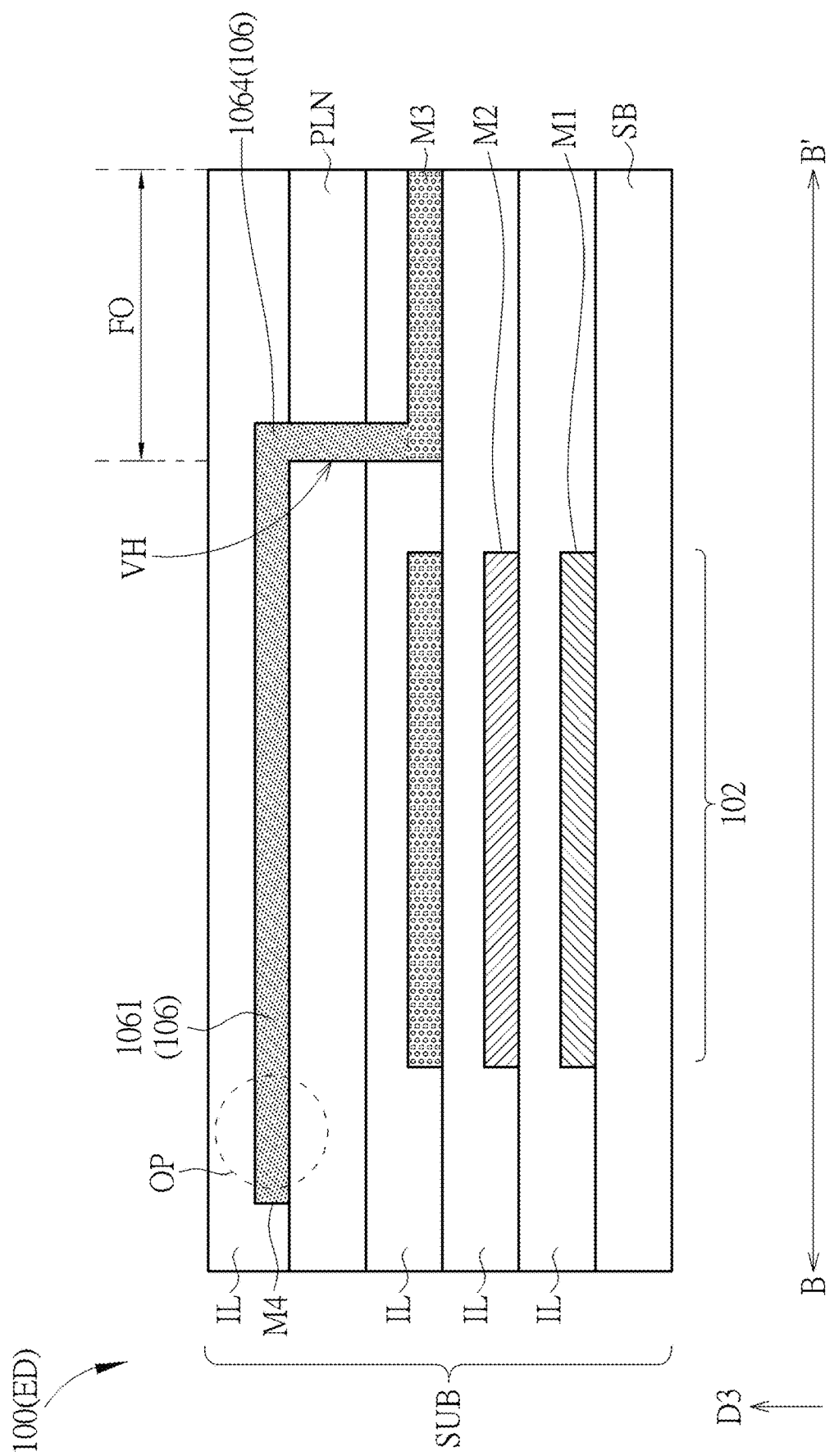
FIG. 4 schematically illustrates a cross-sectional view of an electronic device according to a variant embodiment of the second embodiment of the present disclosure.

Referring to FIG. 3 and FIG. 4, FIG. 3 schematically illustrates a top view of an electronic device according to a second embodiment of the present disclosure, and FIG. 4 schematically illustrates a cross-sectional view of an electronic device according to a variant embodiment of the second embodiment of the present disclosure. In order to simplify the figure, FIG. 4 only shows the base SB, the four metal layers and the planarization layer PLN, and other elements or layers are omitted. In addition, the descriptions of the base SB, the gate driving circuit 102, and the ambient light sensing element 104 of the present embodiment may refer to the contents in the first embodiment, which will not be redundantly described here. One of the main differences between the present embodiment and the first embodiment shown in FIG. 1 is the design of the ambient light sensing signal lines 106. According to the present embodiment, a portion of the ambient light sensing signal lines 106 may be located in the fourth metal layer M4, and another portion of the ambient light sensing signal lines 106 may be located in at least one of the first metal layer M1, the second metal layer M2 and the third metal layer M3, but not limited thereto. For example, when the display device 100 includes a plurality of ambient light sensing signal lines 106, one or more of the ambient light sensing signal lines 106 may be located in the fourth metal layer M4 or formed of the fourth metal layer M4, and another one or more of the ambient light sensing signal lines 106 may be located in other metal layers or formed of other metal layers. For example, as shown in FIG. 3, the display device 100 may for example include four ambient light sensing signal lines 106, wherein the ambient light sensing signal line 1061, the ambient light sensing signal line 1063, and the ambient light sensing signal line 1064 may be located in the fourth metal layer M4, and the ambient light sensing signal line 1062 may be located in the third metal layer M3, but not limited thereto. Or, the ambient light sensing signal line 1061, the ambient light sensing signal line 1063, and the ambient light sensing signal line 1064 may be formed of the third metal layer M3 or the fourth metal layer M4, and the ambient light sensing signal line 1062 may be formed of the third metal layer M3, but not limited thereto. In some embodiments, the ambient light sensing signal line 1062 may be located in the first metal layer M1 or the second metal layer M2, or in some other embodiments, the ambient light sensing signal line 1061 and the ambient light sensing signal line 1062 may be located in the fourth metal layer M4, and the ambient light sensing signal line 1063 and the ambient light sensing signal line 1064 may respectively be located in the third metal layer M3, the second metal layer M2 or the first metal layer M1, the present disclosure is not limited thereto. In other words, in some embodiments, the ambient light sensing signal line 1062 may be formed of the first metal layer M1 or the second metal layer M2, or in some other embodiments, the ambient light sensing signal line 1061 and the ambient light sensing signal line 1062 may be formed of the fourth metal layer M4, and the ambient light sensing signal line 1063 and the ambient light sensing signal line 1064 may respectively be formed of the third metal layer M3, the second metal layer M2 or the first metal layer M1, the present disclosure is not limited thereto. Since the ambient light sensing signal lines 106 may be disposed in different metal layers in the present embodiment, the space requirement of the peripheral region PR may be reduced, and the width of the frame of the display device 100 may be reduced, thereby increasing the screen-to-body ratio of the display device 100.

Or, in a variant embodiment, "a portion of the ambient light sensing signal lines 106 may be located in the fourth metal layer M4, and another portion of the ambient light sensing signal lines 106 may be located in at least one of the first metal layer M1, the second metal layer M2 and the third metal layer M3" mentioned above may represent that a portion of one of the ambient light sensing signal lines 106 is formed of the fourth metal layer M4, and another portion of the one of the ambient light sensing signal lines 106 is formed of the first metal layer M1, the second metal layer M2 or the third metal layer M3, but not limited thereto. In detail, when the ambient light sensing signal line 106 become non-overlapped with the gate driving circuit 102 in the third direction D3, it may be transferred from the fourth metal layer M4 to the first metal layer M1, the second metal layer M2 or the third metal layer M3. That is, a portion of the ambient light sensing signal line 106 may be formed of the fourth metal layer M4, and another portion of the ambient light sensing signal line 106 may be formed of the first metal layer M1, the second metal layer M2 or the third metal layer M3, but not limited thereto. In some embodiments, the other portions of the ambient light sensing signal line 106 (such as the portion OP) which are not overlapped with the gate driving circuit 102 may be transferred to other metal layers, but not limited thereto. For example, as shown in FIG. 4, FIG. 4 schematically illustrates a cross-sectional view of a single ambient light sensing signal line 106 along a section line (such as the section line B-B' shown in FIG. 3). It can be seen from FIG. 4 that after the ambient light sensing signal line 106 passes through the gate driving circuit 102 in the third direction D3 (for example, when the ambient light sensing signal line 106 enters the fan out region FO of the display device 100), it may not overlap the gate driving circuit 102 in the third direction D3. Therefore, the portion of the ambient light sensing signal line 106 located in the fan out region FO may for example be transferred from the fourth metal layer M4 to the third metal layer M3 through a via VH, but not limited thereto. That is, the portion of the ambient light sensing signal line 106 transferred to other metal layers may for example be located in the fan out region FO of the display device 100, but not limited thereto. In some embodiments, a portion of the ambient light sensing signal line 106 may be transferred from the fourth metal layer M4 to the first metal layer M1 or the second metal layer M2. According to the present variant embodiment, since the ambient light sensing signal line 106 may overlap the gate driving circuit 102, and the ambient light sensing signal line 106 may be located in different metal layers through transfer of the ambient light sensing signal line 106, the space requirement of the peripheral region PR may be reduced, and the width of the frame of the display device 100 may be reduced, thereby increasing the screen-to-body ratio of the display device 100.

Figure 5:
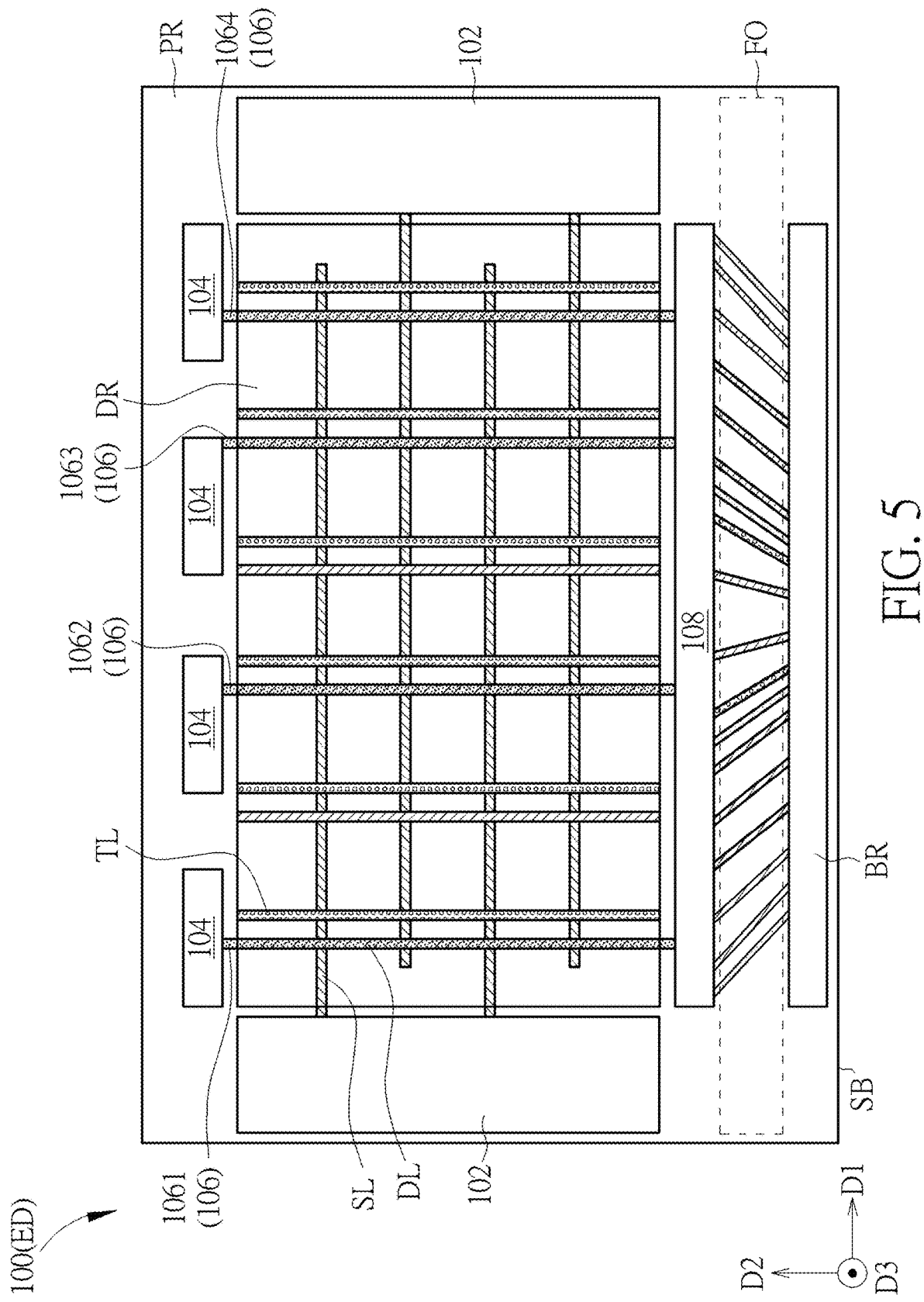
FIG. 5 schematically illustrates a top view of an electronic device according to a third embodiment of the present disclosure.

Referring to FIG. 5, FIG. 5 schematically illustrates a top view of an electronic device according to a third embodiment of the present disclosure. One of the main differences between the present embodiment and the first embodiment shown in FIG. 1 is the design of the ambient light sensing signal line 106. In addition, the descriptions of the base SB, the gate driving circuit 102, and the ambient light sensing element 104 of the present embodiment may refer to the contents in the first embodiment, which will not be redundantly described here. According to the present embodiment, the ambient light sensing signal lines 106 may overlap the data lines DL and/or the scan lines SL in the top view direction (the third direction D3) of the substrate SUB, but not limited thereto. In detail, as shown in FIG. 5, the ambient light sensing signal lines 106 of the present embodiment may extend through the display region DR of the display device 100. In addition, since the ambient light sensing signal lines 106, and the data lines DL and scan lines SL are disposed in different metal layers, the ambient light sensing signal lines 106 may overlap the data lines DL and partially overlap the scan lines SL in the display region DR in the top view direction (the third direction D3), but not limited thereto. In some embodiment, a portion of the ambient light sensing signal lines 106 may overlap the data lines DL and/or the scan lines SL, and another portion of the ambient light sensing signal lines 106 may not overlap the data lines DL and/or the scan lines SL. For example, one or more of the ambient light sensing signal lines 106 may overlap the data lines DL and/or the scan lines SL, or a portion of one of the ambient light sensing signal lines 106 may overlap the data lines DL and/or the scan lines SL. In addition, although FIG. 5 shows the structure that the ambient light sensing signal lines 106 completely overlaps the data lines DL in the display region DR, the present disclosure is not limited thereto. In some embodiments, the ambient light sensing signal lines 106 may partially overlap the data lines DL and/or the scan lines SL. According to the present embodiment, the ambient light sensing signal lines 106 may be disposed in the display region DR of the display device 100. Therefore, the space requirement of the peripheral region PR may be reduced, and the width of the frame of the display device 100 may be reduced, thereby increasing the screen-to-body ratio of the display device 100.

Figure 6:
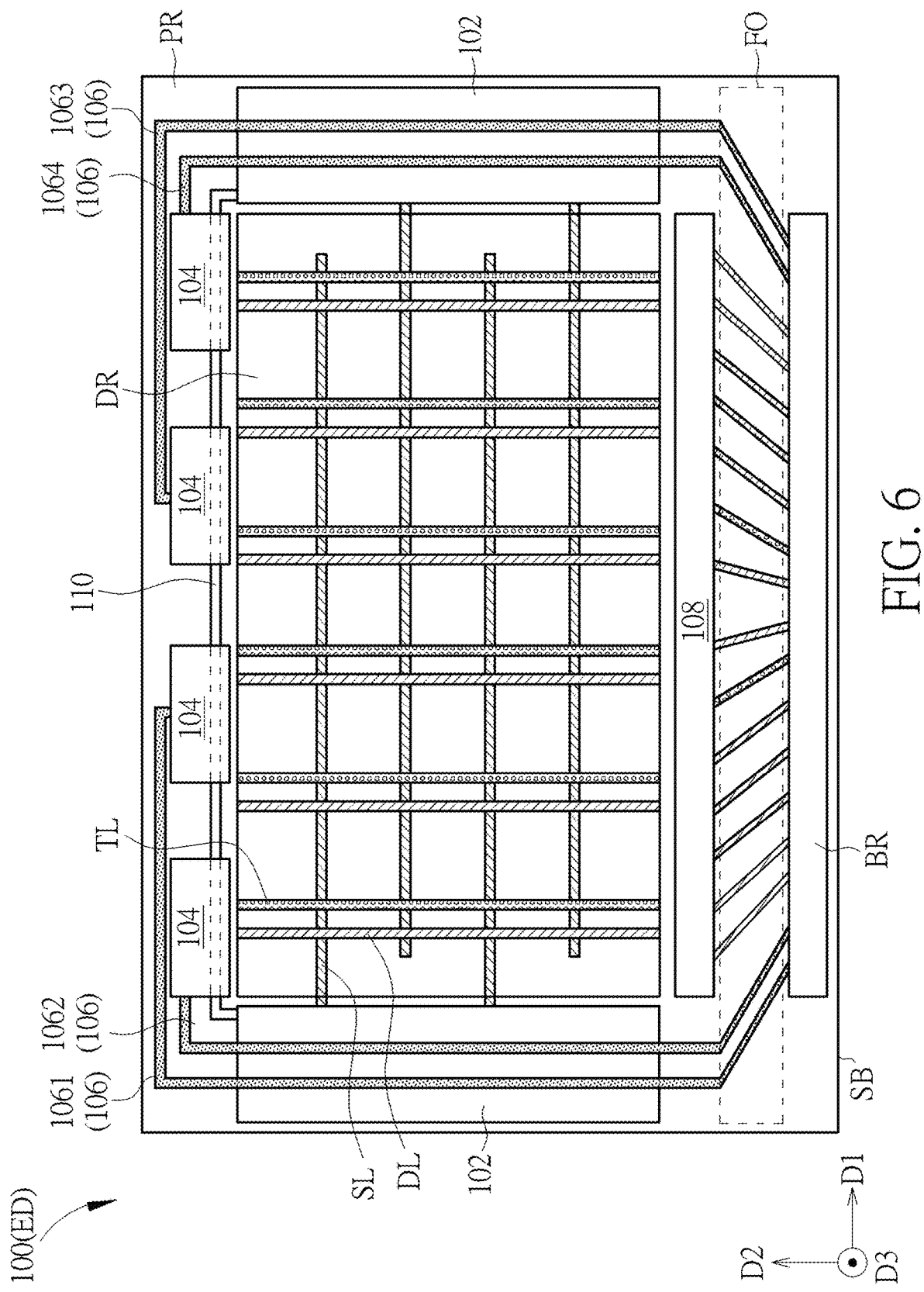
FIG. 6 schematically illustrates a top view of an electronic device according to a fourth embodiment of the present disclosure.

Referring to FIG. 6, FIG. 6 schematically illustrates a top view of an electronic device according to a fourth embodiment of the present disclosure. One of the differences between the present embodiment and the first embodiment shown in FIG. 1 is the design of the ambient light sensing elements 104. In addition, the descriptions of the base SB, the gate driving circuit 102, and the ambient light sensing signal lines 106 of the present embodiment may refer to the contents in the first embodiment, which will not be redundantly described here. According to the present embodiment, the display device 100 may further include a second peripheral element 110 disposed in the peripheral region PR, and the ambient light sensing elements 104 may at least partially overlap the second peripheral element 110 in the top view direction (the third direction D3) of the substrate SUB, but not limited thereto. In detail, as shown in FIG. 6, the display device 100 may further include the second peripheral element 110, wherein the second peripheral element 110 and the ambient light sensing elements 104 may be located in different layers, and the ambient light sensing elements 104 may at least partially overlap the second peripheral element 110 in the top view direction (the third direction D3) of the substrate SUB, but not limited thereto. According to the present embodiment, the second peripheral element 110 may include clock signal lines, electrostatic discharge (ESD) elements, test elements and/or other suitable peripheral elements, but not limited thereto. In FIG. 6, the clock signal line is taken as an example of the second peripheral element 110 for description, and the ambient light sensing elements 104 may at least partially overlap the clock signal line in the top view direction (the third direction D3) of the substrate SUB, wherein the clock signal line may be electrically connected to the two gate driving circuits 102 and provides time signals to the corresponding gate driving circuit 102 to control the time sequence of driving the scan lines. For example, the second peripheral element 110 may be located in the first metal layer, the second metal layer or the third metal layer, or the second peripheral element 110 may be formed of the first metal layer, the second metal layer or the third metal layer, and the metal material of the ambient light sensing elements 104 may be located in the fourth metal layer or formed of the fourth metal layer. The arrangement in the top view direction (the third direction D3) and the order of formation of the metal layers mentioned above may refer to FIG. 2, however, the layers where the second peripheral element 110 and the ambient light sensing elements 104 are located and the order of formation of the metal layers are not limited to the above-mentioned contents. According to the present embodiment, since the ambient light sensing elements 104 and the second peripheral element 110 disposed in the peripheral region PR of the display device 100 may be located in different layers, and the ambient light sensing elements 104 may overlap the second peripheral element 110, the space requirement of the peripheral region PR may be reduced, and the width of the frame of the display device 100 may be reduced, thereby increasing the screen-to-body ratio of the display device 100. The feature of the present embodiment that the display device 100 may include the second peripheral element 110, and the ambient light sensing elements 104 may overlap the second peripheral element 110 may be applied to each of the embodiments and variant embodiments of the present disclosure.

Figure 7:
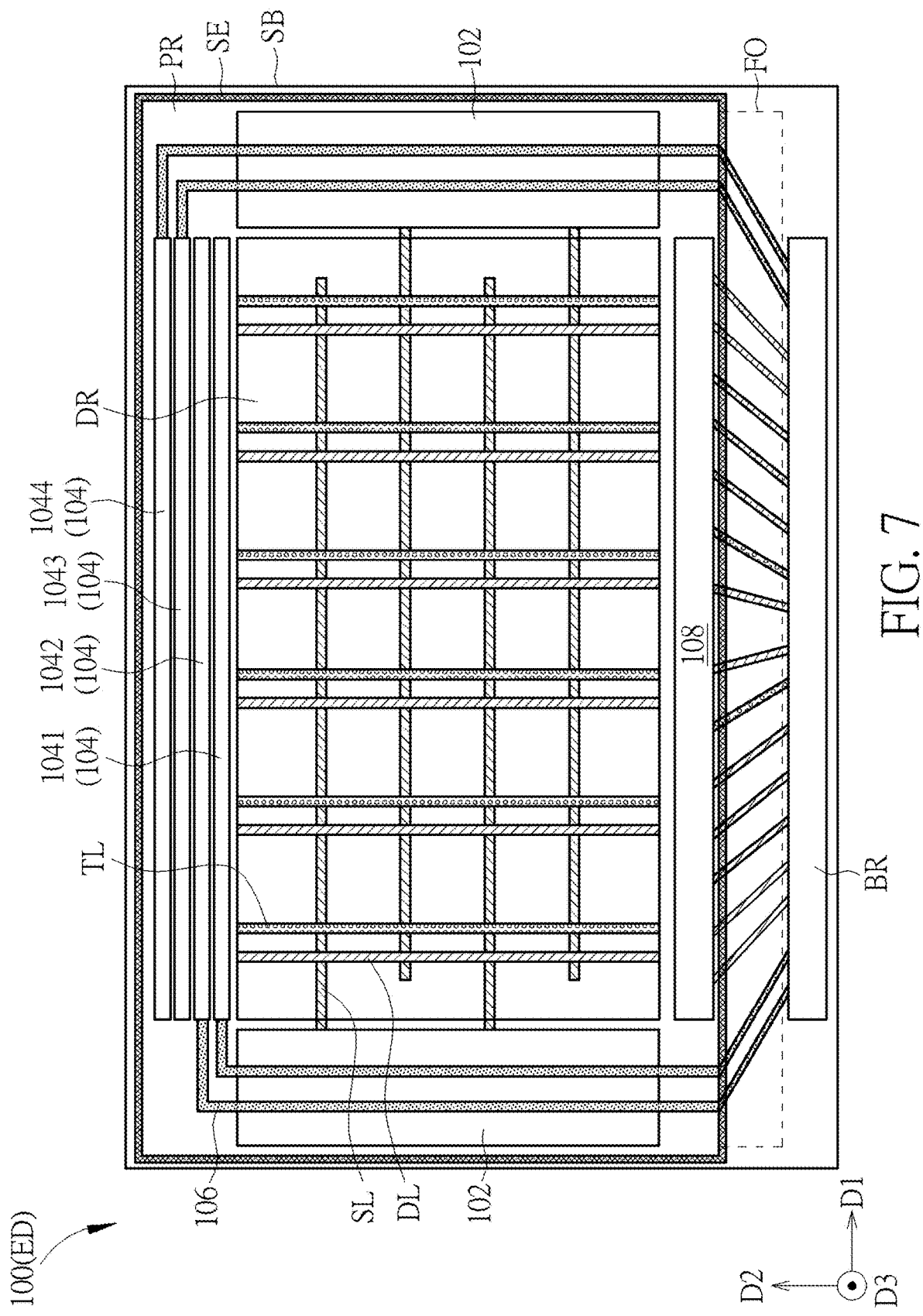
FIG. 7 schematically illustrates a top view of an electronic device according to a fifth embodiment of the present disclosure.

Referring to FIG. 7, FIG. 7 schematically illustrates a top view of an electronic device according to a fifth embodiment of the present disclosure. One of the main differences between the present embodiment and the first embodiment shown in FIG. 1 is the design of the ambient light sensing elements 104. In addition, the descriptions of the base SB, the gate driving circuit 102, and the ambient light sensing signal lines 106 of the present embodiment may refer to the contents in the first embodiment, which will not be redundantly described here. According to the present embodiment, the ambient light sensing elements 104 may for example include a bridge circuit design (such as Wheatstone bridge) to improve the accuracy of light sensing, but not limited thereto. In detail, the display device 100 may for example include four ambient light sensing elements 104 connected in series and parallel, wherein one of the ambient light sensing elements 104 may be a light sensing element that can be irradiated by ambient light and generate a sensing signal, and the other three ambient light sensing elements 104 may be reference elements that do not need to be irradiated by ambient light. For example, the ambient light sensing elements 104 of the present embodiment may for example include PIN diodes, and the four PIN diodes may be connected in series and parallel to form a Wheatstone bridge structure, but not limited thereto. According to the present embodiment, the signal lines between the four ambient light sensing elements 104 which are connected in series and parallel may for example be disposed at the left side and right side of the display device 100 to reduce the width of the upper frame and the lower frame of the display device 100, but not limited thereto. In addition, in the present embodiment, in order to reduce the influence of the non-transmissive elements of the display device 100 on the light sensing function of the ambient light sensing element 104 served as the light sensing element capable of being irradiated by light, the ambient light sensing element 104 served as the light sensing element capable of being irradiated by light may be disposed at a position close to the display region DR of the display device 100 or a position away from the non-transmissive elements of the display device 100, but not limited thereto. For example, as shown in FIG. 7, the display device 100 may include a non-transmissive sealant SE disposed in the peripheral region PR of the display device 100 to seal the electronic elements of the display device 100. In order to reduce the influence of the sealant SE on the light sensing function of the light sensing element capable of being irradiated by light, the four ambient light sensing elements 104 of the present embodiment may for example be arranged side by side along a direction parallel to the extending direction of the data lines DL (such as the second direction D2), or in other words, the four ambient light sensing elements 104 may be vertically arranged, wherein the ambient light sensing element 104 (for example, the ambient light sensing element 1041 shown in FIG. 7) closest to the display region DR or farthest from the sealant SE may be the light sensing element capable of being irradiated by light, and the other ambient light sensing elements 104 (for example, the ambient light sensing element 1042, the ambient light sensing element 1043 and the ambient light sensing element 1044 shown in FIG. 7) may for example be the reference elements, but not limited thereto. It should be noted that although the sealant SE is used as an example of the non-transmissive element in the present embodiment, the present disclosure is not limited thereto. In some embodiments, the disposition of the ambient light sensing elements 104 may be determined according to the positions of other non-transmissive elements of the display device 100. In addition, the arrangement and shape of the ambient light sensing elements 104 having bridge circuit design in the present embodiment are not limited to what is shown in FIG. 7. In some embodiments, the ambient light sensing elements 104 may have different arrangements and/or shapes according to the demands of the design as long as the area (or light sensing area) of the ambient light sensing element 104 served as the light sensing element capable of being irradiated by light is in a proper range. For example, taking a 6-inch smartphone as an example, the area of the ambient light sensing element 104 served as the light sensing element capable of being irradiated by light may for example be lower than 10 square millimeters (that is, area<10 mm2), but not limited thereto. It should be noted that when the area of the light sensing element capable of being irradiated by light is excessively low, the light sensing area of the light sensing element may be insufficient, thereby affecting the accuracy of light sensing. The feature of the present embodiment that the ambient light sensing elements 104 have bridge circuit design may be applied to each of the embodiments and variant embodiments mentioned above. For example, when the ambient light sensing elements 104 are arranged along the first direction D1 (shown in FIG. 1, FIG. 3, FIG. 5 and FIG. 6), the light sensing element capable of being irradiated by light may be any one of the four ambient light sensing elements 104 shown in the above-mentioned figures, but not limited thereto. In addition, although the shape of the ambient light sensing elements 104 shown in FIG. 1, FIG. 3, FIG. 5 and FIG. 6 (such as a block shape, but not limited thereto) is different from the shape of the ambient light sensing elements 104 shown in FIG. 7 (such as a string shape), these ambient light sensing elements 104 may have the same area, wherein the area may for example be in the above-mentioned area range, but not limited thereto. It should be noted that although it is not shown in FIG. 7, the display device 100 of the present embodiment may include the second peripheral element 110 in the above-mentioned fourth embodiment, wherein the second peripheral element 110 may for example overlap at least one of the ambient light sensing elements 104 (such as the ambient light sensing element 1041) in the top view direction (the third direction D3) of the substrate SUB to reduce the space requirement of the peripheral region PR, but not limited thereto.

Figure 8:
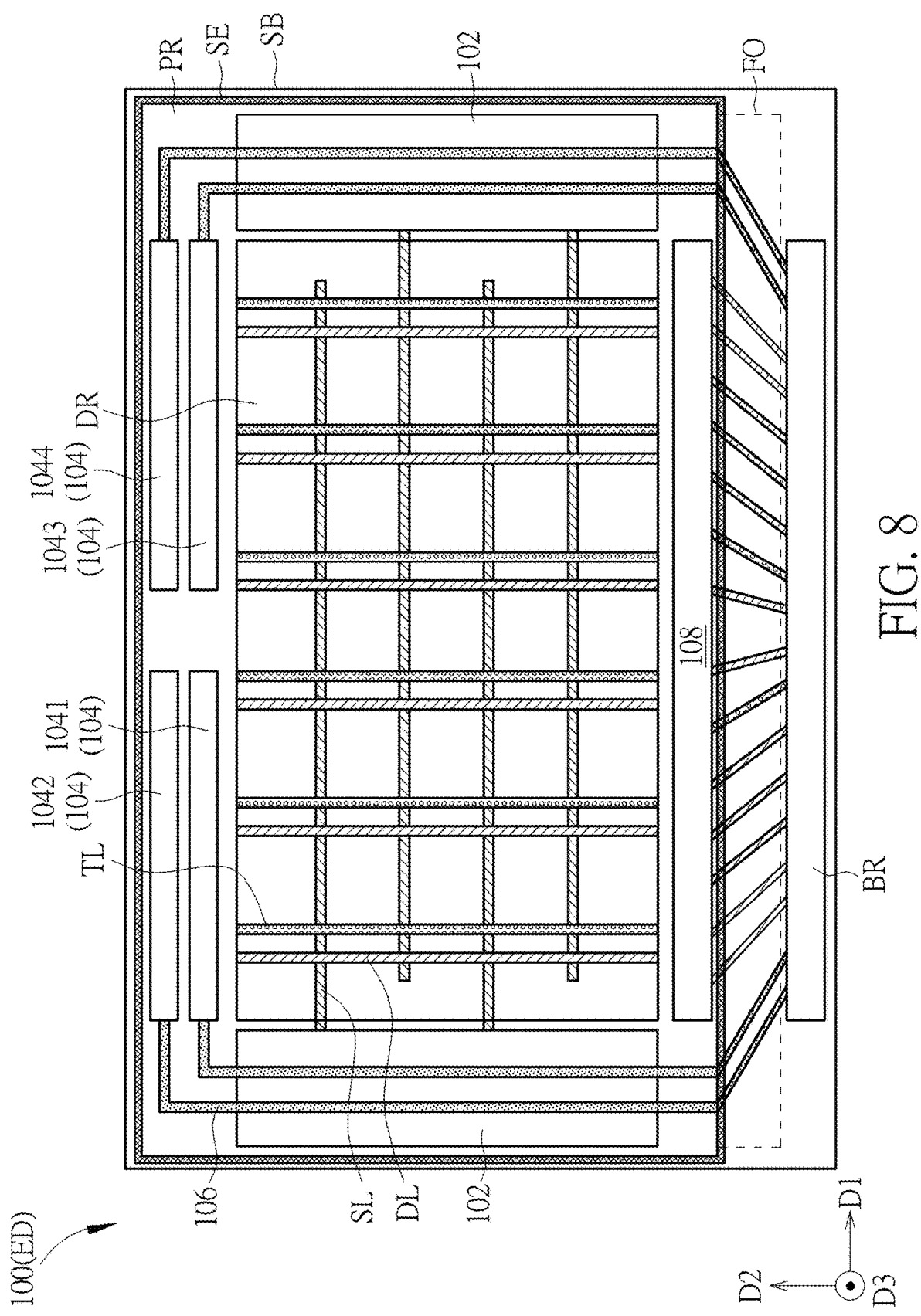
FIG. 8 schematically illustrates a top view of an electronic device according to a variant embodiment of the fifth embodiment of the present disclosure.

Referring to FIG. 8, FIG. 8 schematically illustrates a top view of an electronic device according to a variant embodiment of the fifth embodiment of the present disclosure. One of the main differences between the present embodiment and the fifth embodiment shown in FIG. 7 is the arrangement of the ambient light sensing elements 104. As mentioned above, the display device 100 may for example include four ambient light sensing elements 104 to form a bridge circuit structure, wherein the four ambient light sensing elements 104 may be disposed in the peripheral region PR in a 2*2 array in the present variant embodiment, but not limited thereto. Similarly, in the present variant embodiment, the ambient light sensing element 104 closer to the display region DR and/or farther from the sealant SE may be used as the real light sensing element, and the remaining three ambient light sensing elements 104 may be the reference elements. Therefore, the ambient light sensing element 1041 or the ambient light sensing element 1043 may be the real light sensing element, but not limited thereto. In the present variant embodiment, the range of the area of the ambient light sensing element 104 served as the real light sensing element may refer to the contents of the fifth embodiment mentioned above, and will not be redundantly described. It should be noted that although it is not shown in FIG. 8, the display device 100 of the present embodiment may include the second peripheral element 110 in the fourth embodiment mentioned above, wherein the second peripheral element 110 may for example overlap at least one of the ambient light sensing elements 104 (such as the ambient light sensing element 1041 and the ambient light sensing element 1043) in the top view direction (the third direction D3) of the substrate SUB to reduce the space requirement of the peripheral region PR, but not limited thereto.

Figure 9:
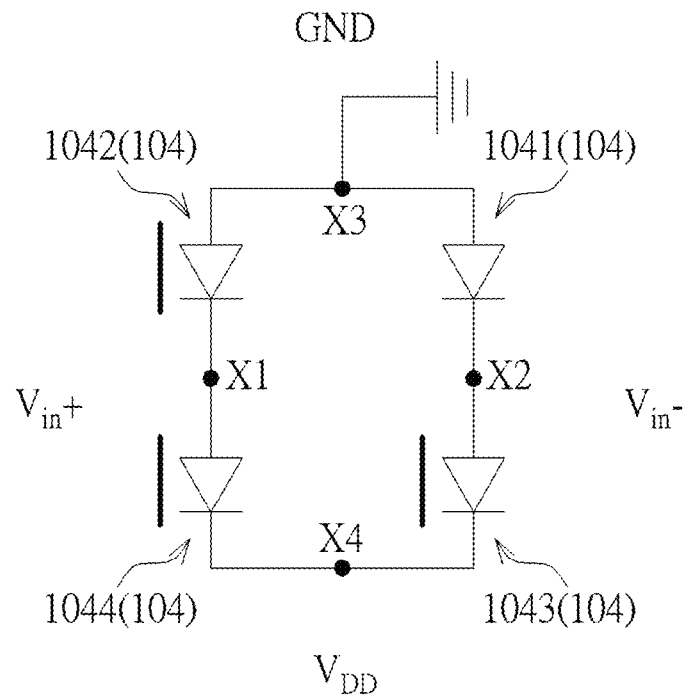
FIG. 9 schematically illustrates the connection of an ambient light sensing element according to the fifth embodiment of the present disclosure.
Figure 10:
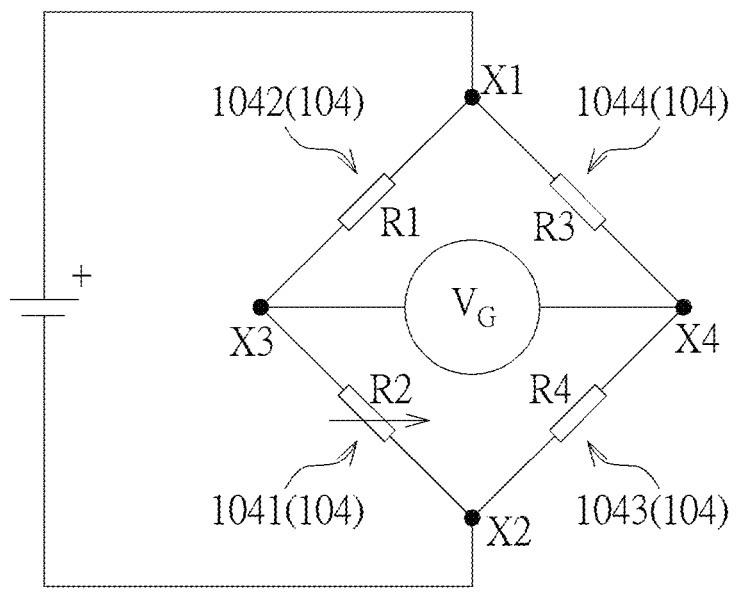
FIG. 10 schematically illustrates the circuit of the ambient light sensing element according to the fifth embodiment of the present disclosure.

Referring to FIG. 9 and FIG. 10, FIG. 9 schematically illustrates the connection of an ambient light sensing element according to the fifth embodiment of the present disclosure, and FIG. 10 schematically illustrates the circuit of the ambient light sensing element according to the fifth embodiment of the present disclosure. As mentioned above, the ambient light sensing elements 104 of the present embodiment may for example have a bridge circuit design by being connected in series and parallel, wherein FIG. 9 exemplarily shows the connection of the ambient light sensing elements 104 (PIN diodes), but not limited thereto. As shown in FIG. 9 and FIG. 10, as well as FIG. 7, the ambient light sensing element 1041 (the light sensing element capable of being irradiated by ambient light to generate sensing signals) may be connected to one of the ambient light sensing element 1042, the ambient light sensing element 1043 and the ambient light sensing element 1044 served as the reference elements (such as the ambient light sensing element 1042, but not limited thereto) in series, the remaining two ambient light sensing elements 104 (such as the ambient light sensing element 1043 and the ambient light sensing element 1044) may be connected to each other in series, and the two circuits in series may be connected in parallel to form the bridge circuit structure, wherein the black vertical lines besides the ambient light sensing element 1042, the ambient light sensing element 1043 and the ambient light sensing element 1044 in FIG. 9 represents that the ambient light sensing element 1042, the ambient light sensing element 1043 and the ambient light sensing element 1044 may be the reference elements which do not need to be irradiated by light, but not limited thereto. In addition, the node X1 between the ambient light sensing element 1042 and the ambient light sensing element 1044 shown in FIG. 9 may have a variable voltage, such as the voltage Vint, the node X2 between the ambient light sensing element 1041 and the ambient light sensing element 1043 shown in FIG. 9 may have a variable voltage, such as the voltage Vin−, the node X3 between the ambient light sensing element 1041 and the ambient light sensing element 1042 shown in FIG. 9 may have a constant voltage, such as being grounded, and the node X4 between the ambient light sensing element 1043 and the ambient light sensing element 1044 shown in FIG. 9 may have a constant voltage, such as the voltage VDD, but not limited thereto. As shown in FIG. 10, in an embodiment, the ambient light sensing element 1042 may have a constant resistance R1, the ambient light sensing element 1044 may have a constant resistance R2, the ambient light sensing element 1043 may have a constant resistance R4, and the ambient light sensing element 1041 served as the real light sensing element may have a variable resistance R3, wherein when the ratio of the resistance R3 to the resistance R1 is equal to the ratio of the resistance R4 to the resistance R2, there is no voltage difference between the node X1 and the node X2. However, when the variable resistance R3 is changed, a voltage difference VG may be generated between the node X1 and the node X2, wherein the voltage difference VG may be determined according to the value of the variable resistance R3. Therefore, by collecting the data of the voltage difference VG between the node X1 and the node X2, the variable resistance R3 of the ambient light sensing element 1041 may be measured, thereby obtaining the ambient light information, but not limited thereto. According to the present embodiment, since the ambient light sensing element 104 may be designed to have a Wheatstone bridge circuit structure, wherein the Wheatstone bridge circuit has the advantage of high measurement accuracy, the ambient light information obtained through the ambient light sensing element 104 may be more accurate, thereby improving the display effect of the display device 100. It should be noted that the design of the Wheatstone bridge circuit is not limited to the present embodiment.

In summary, a display device is provided by the present disclosure, wherein the display device includes the ambient light sensing elements and the ambient light sensing signal lines electrically connected to the ambient light sensing elements. Since the ambient light sensing signal lines and the gate driving circuit may be located in different metal layers, the ambient light sensing signal lines may overlap the gate driving circuit in the top view direction of the substrate to reduce the space requirement of the peripheral region, thereby increasing the screen-to-body ratio of the display device or providing the display device with a narrow frame.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device having a light emitting region, comprising:
   a base;
   a data line disposed on the base, wherein at least a portion of the data line is corresponding to the light emitting region;
   a scan line disposed on the base, wherein at least a portion of the scan line is corresponding to the light emitting region;
   a driving element disposed on the base;
   a light emitting element disposed on the base and corresponding to the light emitting region;
   an optical sensing element configured to sense a light and generate a signal; and
   a signal line electrically connected to the optical sensing element and configured to transmit the signal,
   wherein the signal line is extending along a direction, and along the direction, at least a portion of the signal line corresponding to the light emitting region is overlapped with the data line and the scan line.

2. The electronic device of claim 1, wherein the scan line crosses the data line.

3. The electronic device of claim 1, wherein the scan line and the data line are disposed in different layers.

4. The electronic device of claim 1, wherein the signal line comprises copper, silver, gold or aluminum.

5. The electronic device of claim 1, wherein the driving element is electrically connected to the data line and the light emitting element.

6. The electronic device of claim 1, wherein the light emitting element comprises an organic light emitting diode.

7. The electronic device of claim 1, wherein the data line and the signal line are disposed in different layers.

* * * * *